United States Patent
Chao

(10) Patent No.: US 8,071,989 B2
(45) Date of Patent: Dec. 6, 2011

(54) MULTI-CHIP PACKAGE WITH A PLURALITY OF CHIP PADS ARRANGED IN AN ARRAY

(75) Inventor: Tzu-Hao Chao, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 96 days.

(21) Appl. No.: 12/621,529

(22) Filed: Nov. 19, 2009

(65) Prior Publication Data

US 2010/0123144 A1    May 20, 2010

(30) Foreign Application Priority Data

Nov. 20, 2008    (TW) ................ 97144960 A

(51) Int. Cl.
*H01L 29/205* (2006.01)
(52) U.S. Cl. ................ 257/89; 257/E33.002
(58) Field of Classification Search .......... 257/89, 257/E27.121, E33.002
See application file for complete search history.

(56) References Cited

U.S. PATENT DOCUMENTS

2008/0191222 A1 * 8/2008 Lee ............................ 257/91

FOREIGN PATENT DOCUMENTS

WO    WO 2007055457 A1 * 5/2007

* cited by examiner

*Primary Examiner* — Thomas L Dickey
(74) *Attorney, Agent, or Firm* — Jianq Chyun IP Office

(57) ABSTRACT

A circuit structure of a package carrier including a plurality of chip pads, a first electrode, a second electrode, a third electrode and a fourth electrode is provided. These chip pads are arranged in an M×N array. A first bonding pad, a second bonding pad, a third bonding pad and a fourth bonding pad are disposed clockwise in the peripheral area of each chip pad in sequence. The orientations of each of the first, second, third, and fourth bonding pads of the $(S-1)^{th}$ row rotated by 90 degrees are equal to the orientations of each of the first, second, third and fourth bonding pads of the $S^{th}$ row, respectively. The first electrode is connected with each first bonding pad. The second electrode is connected with each second bonding pad. The third electrode is connected with each third bonding pad. The fourth electrode is connected with each fourth bonding pad.

9 Claims, 3 Drawing Sheets

MULTI-CHIP PACKAGE WITH A PLURALITY OF CHIP PADS ARRANGED IN AN ARRAY

CROSS-REFERENCE TO RELATED APPLICATION

This application claims the priority benefit of Taiwan application serial no. 97144960, filed Nov. 20, 2008. The entirety of the above-mentioned patent application is hereby incorporated by reference herein and made a part of specification.

BACKGROUND OF THE INVENTION

1. Field of the Invention

The present invention relates to a circuit structure of a package carrier and a multi-chip package having the circuit structure, and more particularly, to a circuit structure suitable for carrying a plurality of wire bonding light emitting diode (LED) chips and a multi-chip package having the circuit structure.

2. Description of Related Art

The advanced countries in the world are all currently devoting time and effort to the development of opto-electronic material industry. The LED has longevity and low power consumption and thus application thereof is becoming popular. The LED can be used in applications such as large electronic billboard, traffic lights, turn signals of vehicles, and illumination. The current LED industry is advancing toward the goal of high brightness and low light loss so that the LED is able to replace conventional illumination means.

However, to increase the brightness of the LED and to decrease the light loss thereof, the package method of the LED is a key factor influencing the brightness, uniformity of illumination, and element lifespan of the LED in addition to improving the structure of the LED itself. In the conventional technology, a plurality of LED chips is packaged on a same substrate by means of a multi-chip packaging method to form a multi-chip package. Therefore, the multi-chip package including a plurality of LED chips has more diversified brightness and color. The plurality of LED chips in the multi-chip package may be electrically connected in parallel, in series, or in series-parallel.

In the conventional technology, a plurality of chip pads in the multi-chip package are arranged in arrays and a plurality of bonding pads respectively connected to different electrodes are disposed in a peripheral area of each of the LED chips. The orientations of the bonding pads in the peripheral area of each chip pad are the same. Each of the LED chips is disposed on each of the chip pads and is respectively electrically connected to the different bonding pads in the peripheral area of each of the chip pads through a first conductive line and a second conductive line so that the LED chips are connected to each other in parallel, in series, or in series-parallel.

When the LED chips in the multi-chip package are electrically connected in series or in series-parallel, one of the LED chips may be respectively electrically connected to a first bonding pad and a second bonding pad in the peripheral area of the LED chip through the first conductive line and the second conductive line. Another LED chip may be respectively electrically connected to the second bonding pad and a third bonding pad in the peripheral area of the LED chip through the first conductive line and the second conductive line. Therefore, the wire bonding directions of the mentioned two LED chips are different.

However, in the manufacturing process of wire bonding, changing the wire bonding direction decreases the speed and yield of wire bonding and thereby causes low productivity and high costs. Hence, how to enable LED chips to be electrically connected in series or in series-parallel without changing wire bonding direction is currently an issue to be resolved.

SUMMARY OF THE INVENTION

The present invention provides a circuit structure of a package carrier in which wire bonding direction does not need to be changed in a subsequent wire bonding process.

The present invention further provides a multi-chip package for which wire bonding direction does not need to be changed in the manufacturing process so that the speed and yield of the wire bonding process are increased.

The present invention provides a circuit structure of a package carrier suitable for carrying a plurality of wire bonding LED chips. The circuit structure includes a plurality of chips pads, a plurality of first bonding pads, a plurality of second bonding pads, a plurality of third bonding pads, a plurality of fourth bonding pads, a first electrode, a second electrode, a third electrode, and a fourth electrode. The chip pads are arranged in an M×N array for disposing the LED chips. One of the first bonding pads, one of the second bonding pads, one of the third bonding pads, and one of the fourth bonding pads are sequentially arranged in a peripheral area of each chip pad. The orientations of each of the first to fourth bonding pads in the $S^{th}$ row are different from the orientations of each of the first to fourth bonding pads in the $(S-1)^{th}$ row and the $(S+1)^{th}$ row by 90 degrees, the M and N are positive integers greater than 1 and S is a positive integer in the range of 2~N. The first electrode has a plurality of first branch lines respectively connected to the M first bonding pads in the $1^{st}$~$N^{th}$ rows. The second electrode has a plurality of second branch lines respectively connected to the M second bonding pads in the $1^{st}$~$N^{th}$ rows. The third electrode has a plurality of third branch lines respectively connected to the M third bonding pads in the $1^{st}$~$N^{th}$ rows. The fourth electrode has a plurality of fourth branch lines respectively connected to the M fourth bonding pads in the $1^{st}$~$N^{th}$ rows.

In one embodiment of the present invention, the orientations of each of the first to fourth bonding pads in the $S^{th}$ row are different from the orientations of each of the first to fourth bonding pads in the $(S-1)^{th}$ row with 90 degrees in the counterclockwise direction.

In one embodiment of the present invention, the orientations of each of the first to fourth bonding pads in the $S^{th}$ row are different from the orientations of each of the first to fourth bonding pads in the $(S-1)^{th}$ row by 90 degrees in the clockwise direction.

In one embodiment of the present invention, the first electrode has a first main body portion, the second electrode has a second main body portion, the third electrode has a third main body portion, the fourth electrode has a fourth main body portion. The first, second, third, and fourth main body portions are arranged clockwise and in sequence in the peripheral area of the M×N array formed by the chip pads.

In one embodiment of the present invention, the first branch lines extend toward the chip pads from the first main body portions and are connected respectively with the M first bonding pads of the $1^{st}$~$N^{th}$ rows.

In one embodiment of the present invention, the second branch lines extend toward the chip pads from the second main body portions and are connected respectively with the M second bonding pads of the $1^{st}$~$N^{th}$ rows.

In one embodiment of the present invention, the third branch lines extend toward the chip pads from the third main body portions and are connected respectively with the M third bonding pads of the $1^{st}$~$N^{th}$ rows.

In one embodiment of the present invention, the fourth branch lines extend toward the chip pads from the fourth main body portions and are connected respectively with the M fourth bonding pads of the $1^{st}$~$N^{th}$ rows.

In one embodiment of the present invention, the first branch lines and the second branch lines are alternately arranged.

In one embodiment of the present invention, the third branch lines and the fourth branch lines are alternately arranged.

The present invention provides a multi-chip package including a substrate, a plurality of chip pads, a plurality of LED chips, a first electrode, a second electrode, a third electrode, and a fourth electrode. The chip pads are disposed on the substrate and are arranged in an M×N array. A peripheral area of each of the chip pads includes a first bonding pad, a second bonding pad, a third bonding pad, and a fourth bonding pad arranged clockwise and in sequence. The orientations of each of the first to fourth bonding pads in the $S^{th}$ row respectively are different from the orientations of each of the first to fourth bonding pads in the $(S-1)^{th}$ and the $(S+1)^{th}$ by 90 degrees, wherein M and N are positive integers greater than 1 and S is a positive integer in the range of 2~N. Each of the LED chips is disposed on one of the chip pads. The first electrode has a plurality of first branch lines respectively connected to the M first bonding pads in the $1^{st}$~$N^{th}$ rows. The second electrode has a plurality of second branch lines respectively connected to the M second bonding pads in the $1^{st}$~$N^{th}$ rows. The third electrode has a plurality of third branch lines respectively connected to the M third bonding pads in the $1^{st}$~$N^{th}$ rows. The fourth electrode has a plurality of fourth branch lines respectively connected to the M fourth bonding pads in the $1^{st}$~$N^{th}$ rows. Each LED chip is electrically connected to two of the bonding pads on a same side of each LED chip, wherein the two bonding pads are selected from the first, second, third, and fourth bonding pads.

In one embodiment of the present invention, the orientations of each of the first to fourth bonding pads in the $S^{th}$ row are different from the orientations of each of the first to fourth bonding pads in the $(S-1)^{th}$ by 90 degrees in the counterclockwise direction.

In one embodiment of the present invention, the orientations of each of the first to fourth bonding pads in the $S^{th}$ row are different from the orientations of each of the first to fourth bonding pads in the $(S-1)^{th}$ row by 90 degrees in the clockwise direction.

In one embodiment of the present invention, the first electrode has a first main body portion, the second electrode has a second main body portion, the third electrode has a third main body portion, the fourth electrode has a fourth main body portion. The first, second, third, and fourth main body portions are arranged clockwise and in sequence in the peripheral area of the M×N array formed by the chip pads.

In one embodiment of the present invention, the substrate includes an insulation layer, wherein the first electrode, the second electrode, and the first to fourth bonding pads are disposed on the insulation layer, and the third electrode and the fourth electrode are disposed under the insulation layer and pass through the insulation layer to respectively connect to the third and fourth bonding pads.

In one embodiment of the present invention, the multi-chip package further includes a plurality of first conductive lines and a plurality of second conductive lines, wherein each of the first conductive lines and each of the second conductive lines are respectively electrically connected to each LED chip and two of the bonding pads on a same side of each LED chip.

In one embodiment of the present invention, the first conductive lines in each pair and the second conductive lines in each pair are respectively electrically connected to each LED chip and two of the bonding pads on a same side of each LED chip.

In one embodiment of the present invention, the multi-chip package further includes a coating layer disposed on the insulation layer and covering the first, second, third, and fourth bonding pads. The coating layer has a plurality of openings to expose the LED chips and portions of the first to fourth bonding pads in the peripheral area of each LED chip, wherein the portions of the first to fourth bonding pads are adjacent to each LED chip.

In one embodiment of the present invention, the coating layer is formed of resin.

In light of the above illustration, the orientations of each of the first to fourth bonding pads in the $S^{th}$ row are different from the orientations of each of the first to fourth bonding pads in the $(S-1)^{th}$ row by a quadrant (90 degrees). Therefore, the first conductive line and the second conductive line may respectively be electrically connected to two bonding pads on a same side of each LED chip. As such, in the present invention, the direction of wire bonding does not need to be changed when fabricating the first and second conductive lines.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
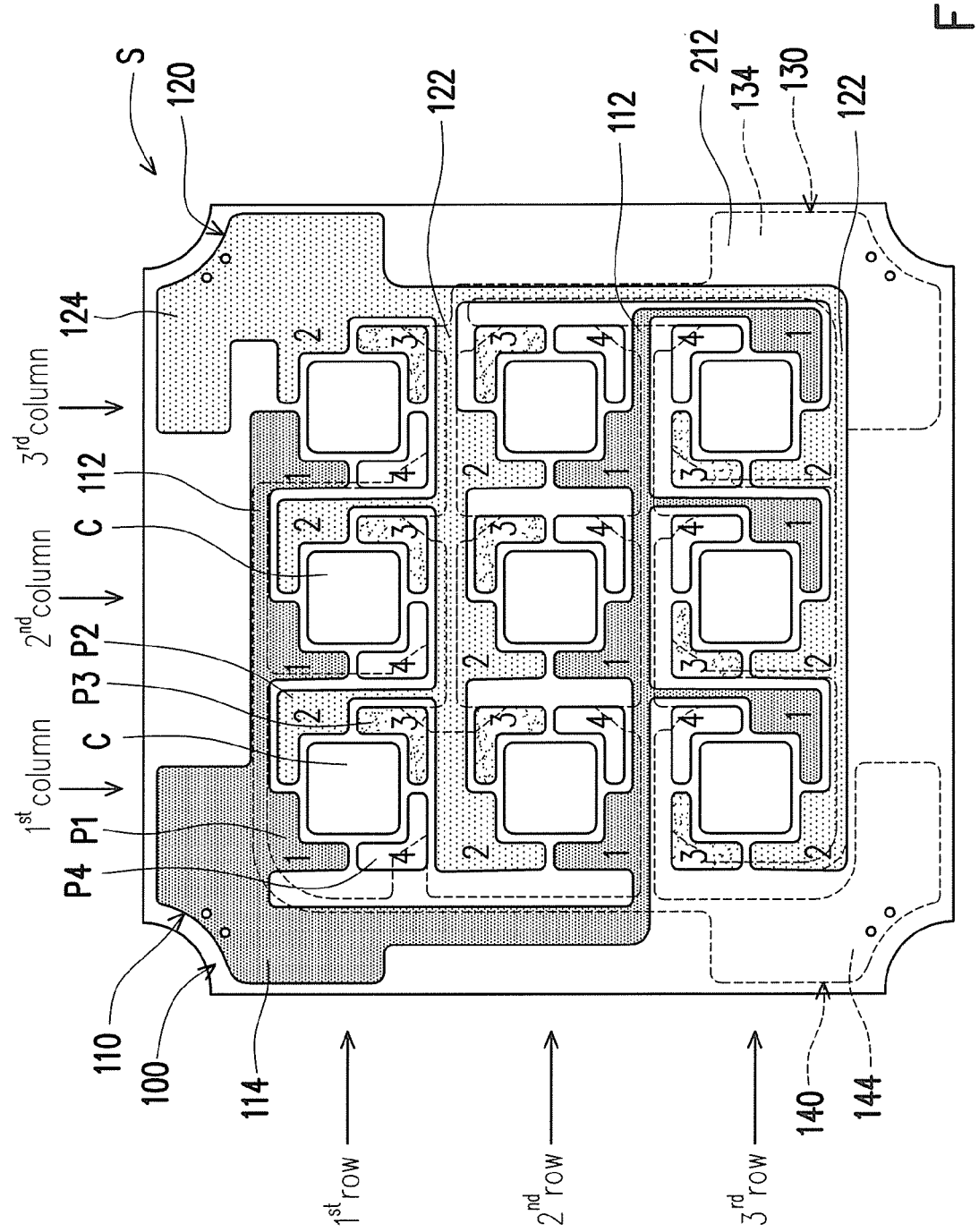
FIG. 1A is a schematic view illustrating a circuit structure of a package carrier according to one embodiment of the present invention.
Figure 1B:
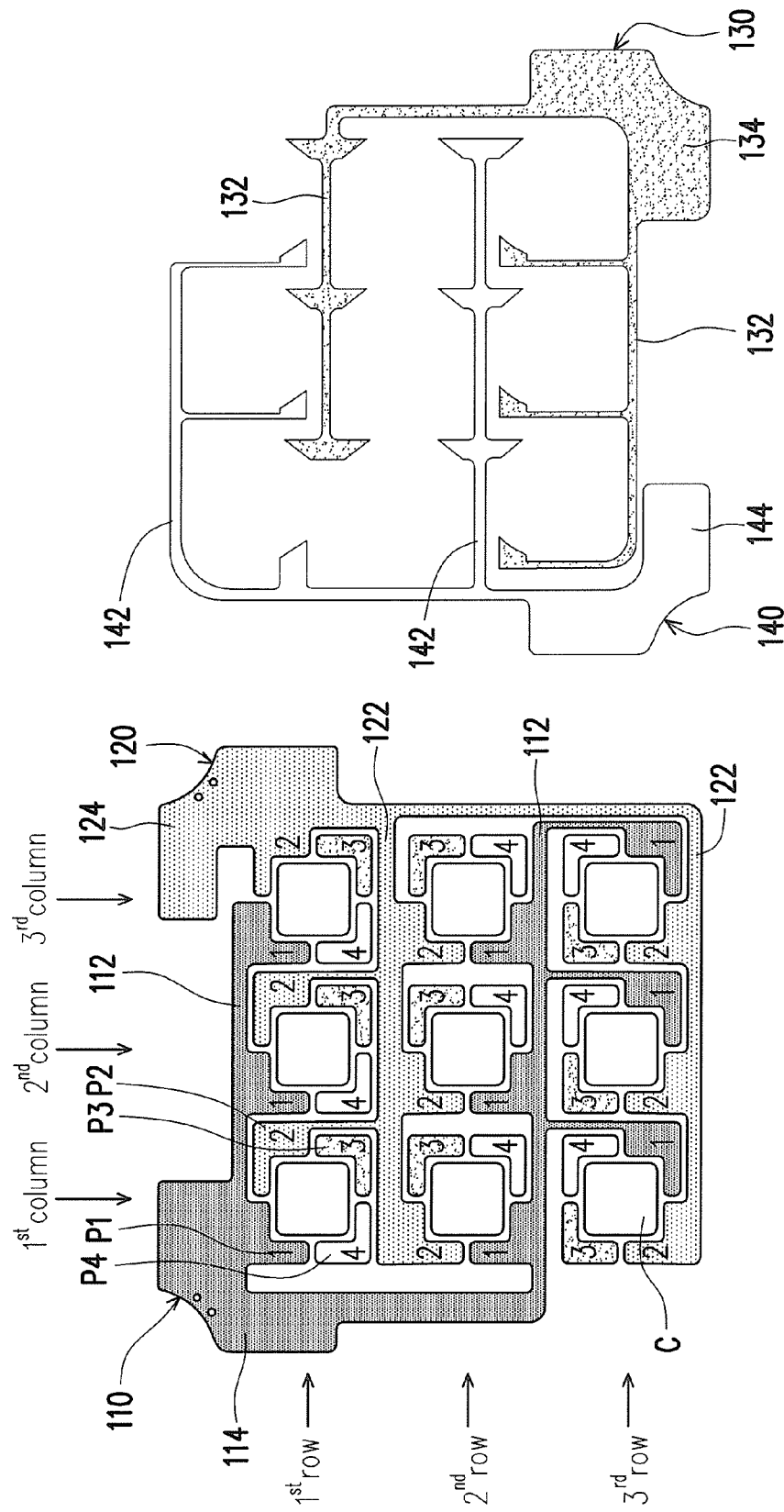
FIG. 1B is an exploded view illustrating the circuit structure of the package carrier of FIG. 1A.

FIG. 1A is a schematic view illustrating a circuit structure of a package carrier according to one embodiment of the present invention. FIG. 1B is an exploded view illustrating the circuit structure of the package carrier of FIG. 1A.

Referring to FIG. 1A and FIG. 1B simultaneously, a circuit structure 100 of a package carrier S of the present embodiment is suitable for carrying a plurality of wire bonding LED chips (not shown). The circuit structure 100 includes a plurality of chip pads C, a first bonding pad P1, a second bonding pad P2, a third bonding pad P3, a fourth bonding pad P4, a first electrode 110, a second electrode 120, a third electrode 130, and a fourth electrode 140. The chip pads C are arranged in an M×N array for disposing the LED chips, the M and N are positive integers greater than 1. For convenience of illustration, a 3×3 array formed by nine chip pads C is used for the purpose of illustration in the present embodiment, which, however, is not intended to limit the number of chip pads C and the values of M and N of the present invention.

The first bonding pad P1, the second bonding pad P2, the third bonding pad P3, and the fourth bonding pad P4 are sequentially arranged in a peripheral area of each chip pad C. Orientations of each of the first to fourth bonding pads in the $S^{th}$ row are different respectively from the first to fourth bonding pads in the $(S-1)^{th}$ and the $(S+1)^{th}$ row by a quadrant (90 degrees), wherein S is a positive integer in the range of 2~N. In the present embodiment, the orientation of each bonding pad P is, for example, the orientation of each bonding pad P in relation to a center of the chip pad C corresponding to the bonding pad P.

In the present embodiment, when S is 2, the orientations of each of the first to fourth bonding pads P1~P4 in the $S^{th}$ row are different respectively from the orientations of each of the first to fourth bonding pads P1~P4 in the $(S-1)^{th}$ row by a quadrant (90 degrees). For example, the orientations of each of the first to fourth bonding pads P1~P4 in the $S^{th}$ row are different respectively from the orientations of each of the first to fourth bonding pads P1~P4 in the $(S-1)^{th}$ row by 90 degrees in the counterclockwise direction. The orientations of each of the first to fourth bonding pads P1~P4 in the $(S+1)^{th}$ row are different respectively from the orientations of each of the first to fourth bonding pads P1~P4 in the S row by 90 degrees in the counterclockwise direction. In other words, the orientations of each of the first to fourth bonding pads P1~P4 in the $(S-1)^{th}$ row rotated by 90 degrees in the counterclockwise direction are equal to the orientations of each of the first to fourth bonding pads P1~P4 in the $S^{th}$ row. The orientations of each of the first to fourth bonding pads P1~P4 in the $S^{th}$ row rotated by 90 degrees in the counterclockwise direction are equal to the orientations of each of the first to fourth bonding pads P1~P4 in the $(S+1)^{th}$ row. Certainly, in other embodiments, the orientations of each of the first to fourth bonding pads P1~P4 in the $S^{th}$ row and the $(S+1)^{th}$ row may be different respectively from the orientations of each of the first to fourth bonding pads P1~P4 in the $(S-1)^{th}$ row and the $S^{th}$ row by 90 degrees in the clockwise direction.

Referring to FIG. 1A and FIG. 1B again, in order for the M first bonding pads P1 in the $1^{st}$~$N^{th}$ rows to connect to the first electrode 110, the first electrode 110 may have a plurality of first branch lines 112 through which the first electrode 110 is respectively connected to the M first bonding pads P1 in the $1^{st}$~$N^{th}$ rows. Similarly, the second electrode 120 has a plurality of second branch lines 122 through which the second electrode 120 is respectively connected to the M second bonding pads P2 in the $1^{st}$~$N^{th}$ rows. The third electrode 130 has a plurality of third branch lines 132 through which the third electrode 130 is respectively connected to the M third bonding pads P3 in the $1^{st}$~$N^{th}$ rows. The fourth electrode 140 has a plurality of fourth branch lines 142 through which the fourth electrode 140 is respectively connected to the M fourth bonding pads P4 in the $1^{st}$~$N^{th}$ rows.

In addition, in the present embodiment, the first electrode 110 has a first main body portion 114, the second electrode 120 has a second main body portion 124, the third electrode 130 has a third main body portion 134, and the fourth electrode 140 has a fourth main body portion 144. Moreover, the first main body portion 114, the second main body portion 124, the third main body portion 134, and the fourth main body portion 144 are, for example, sequentially arranged in a clockwise direction in the peripheral area of the M×N array formed by the plurality of chip pads C.

In one embodiment of the present invention, the first branch lines 112 may extend from the first main body portion 114 to the right and are connected sequentially to the M first bonding pads P1 of the $1^{st}$~$N^{th}$ rows. In one embodiment of the present invention, the second branch lines 122 may extend from the second main body portion 124 to the left and are connected sequentially to the M second bonding pads P2 of the $1^{st}$~$N^{th}$ rows. From the above illustration, the first branch lines 112 and the second branch lines 122 are alternately arranged but are not connected.

In one embodiment of the present invention, the third branch lines 132 may extend from the third main body portion 134 to the left and are connected sequentially to the M third bonding pads P3 of the $1^{st}$~$N^{th}$ rows. The fourth branch lines 142 may extend from the fourth main body portion 144 to the right and are connected sequentially to the M fourth bonding pads P4 of the $1^{st}$~$N^{th}$ rows. From the above illustration, the third branch lines 132 and the fourth branch lines 142 are alternately arranged but are not connected. It should be noted that the afore-mentioned arrangement of the first to fourth branch lines 112, 122, 132, and 142 is one embodiment of the present invention and is not intended to limit the scope of the present invention. Persons skilled in the art may make modification and variation thereto without departing from the scope of the present invention.

A detailed illustration on a multi-chip package having the circuit structure 100 is given below.

Figure 2:
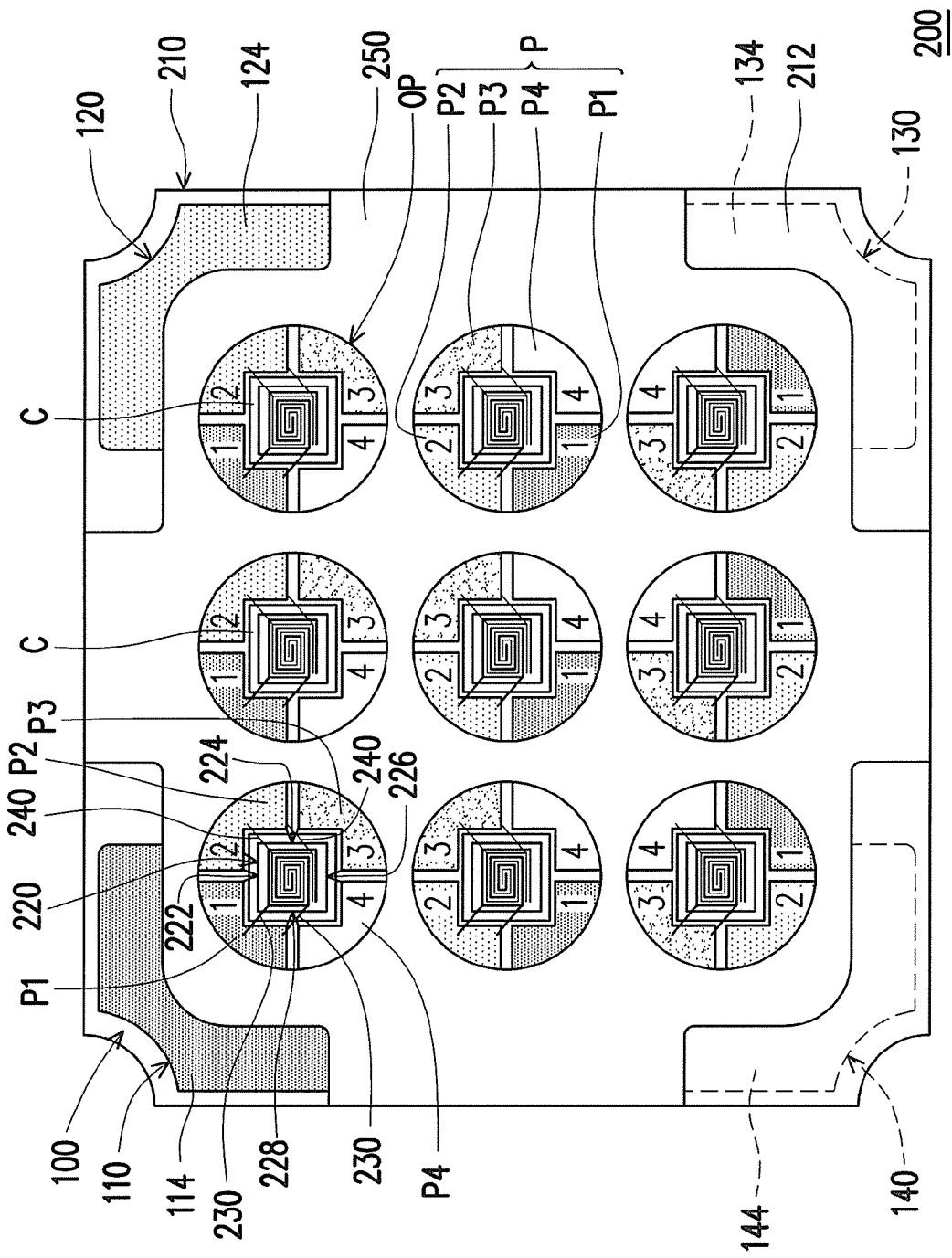
FIG. 2 is a schematic view illustrating a multi-chip package according to one embodiment of the present invention.

FIG. 2 is a schematic view of a multi-chip package according to one embodiment of the present invention. Referring to FIG. 1A, FIG. 1B, and FIG. 2, a multi-chip package 200 of the present embodiment includes a substrate 210, a plurality of chip pads C, a plurality of LED chips 220, a first electrode 110, a second electrode 120, a third electrode 130, and a fourth electrode 140, wherein the chip pads C and the first to fourth electrodes 110, 120, 130, and 140 form the circuit structure 100.

Simultaneously referring to FIG. 1A, FIG. 1B, and FIG. 2, in the present embodiment, to insulate among the first electrode 110, the second electrode 120, the third electrode 130, and the fourth electrode 140, the substrate 210 has an insulation layer 212, and the first electrode 110, the second electrode 120, and the first to fourth bonding pads P1~P4 are all disposed on the insulation layer 212.

The third electrode 130 and the fourth electrode 140 are both disposed under the insulation layer 212 and pass through the insulation layer 212 to respectively connect to the third bonding pad P3 and the fourth bonding pad P4. In FIG. 1A, since the third electrode 130 and the fourth electrode 140 are both disposed under the insulation layer 212, the third electrode 130 and the fourth electrode 140 are illustrated with dotted lines. The third electrode 130 and the fourth electrode 140 respectively connect to the third bonding pad P3 and the fourth bonding pad P4 via a plurality of through holes (not shown) passing through the insulation layer 212. Certainly, in other embodiments, the first electrode 110, the second electrode 120, the third electrode 130, and the fourth electrode 140, and the first to fourth bonding pads P1~P4 may all be disposed on a same plane via other circuit layouts.

Each of the LED chips 220 is disposed on one of the chip pads C. Each LED chip 220 is electrically connected to two of the bonding pads P on a same side of each LED chip 220, wherein the two bonding pads P are selected from the first bonding pad P1, the second bonding pad P2, the third bonding pad P3, and the fourth bonding pad P4. For example, the multi-chip package 200 may include a plurality of first conductive lines 230 and a plurality of second conductive lines 240, wherein each of the first conductive lines 230 and each of the second conductive lines 240 are respectively electrically connected to each LED chip 220 and two of the bonding pads P on a same side of each LED chip 220. As such, the LED chips 220 are electrically connected in series-parallel, wherein the LED chips 220 in a same row are connected in parallel and the LED chips 220 in adjacent rows are connected in series.

In the present embodiment, each LED chip 220 has the first conductive lines 230 and the second conductive lines 240 in pairs. It is illustrated in FIG. 2 that the first conductive lines 230 in each pair and the second conductive lines 240 in each pair are respectively electrically connected to each LED chip 220 and two of the bonding pads P on a same side 222 of each LED chip 220. In other words, the first conductive lines 230 in pair are electrically connected to the LED chip 220 and one of the bonding pads P on the side 222 of the LED chip 220 and the second conductive lines 240 in pair are electrically connected to the LED chip 220 and the other of the bonding pads P on the same side 222 of the LED chip 220.

It should be noted that in the present embodiment, each of the LED chips 220 has four sides 222, 224, 226, and 228. The first conductive lines 230 in each pair and the second conductive lines 240 in each pair may respectively be electrically connected to two bonding pads P on any side of each LED chip 220. Each pair of the first conducive lines 230 and each pair of the second conductive lines 240 are respectively electrically connected to two bonding pads P on a same side of each LED chip 220.

Compared to the conventional technology, in the present embodiment, the orientations of each of the first to fourth bonding pads P1~P4 in the $S^{th}$ row of the circuit structure 100 differ respectively with the orientations of each of the first to fourth bonding pads P1~P4 in the $(S-1)^{th}$ row by 90 degrees. Therefore, the first conductive line 230 and the second conductive line 240 may respectively be electrically connected to two of the bonding pads P on a same side of each LED chip 220. As such, in the present invention, the direction of wire bonding does not need to be changed when fabricating the first conductive lines 230 and the second conductive lines 240. In light of the above, when fabricating the multi-chip package 200 of the present embodiment, the speed and yield of the wire bonding process are improved and thus productivity is promoted and cost is decreased.

In addition, in the present embodiment, the multi-chip package 200 further includes a coating layer 250 disposed on the insulation layer 212 and covering the first to fourth electrodes 110, 120, 130, and 140 and the first to fourth bonding pads P1~P4 to protect the first to fourth electrodes 110, 120, 130, and 140 and the first to fourth bonding pads P1~P4. The coating layer 250 has a plurality of openings OP to expose the LED chips 220 and portions of the first to fourth bonding pads P1~P4 in the peripheral area of each LED chip 220, wherein the portions of the first to fourth bonding pads P1~P4 are adjacent to each LED chip 220. A material of the coating layer 250 includes insulating materials such as resin.

In summary, the orientations of each of the first to fourth bonding pads in the $S^{th}$ row of the circuit structure of the present invention are different from the orientations of each of the first to fourth bonding pads in the $(S-1)^{th}$ row by 90 degrees. Therefore, the first conductive line and the second conductive line may respectively be electrically connected to two bonding pads on a same side of each LED chip. As such, in the present invention, the direction of wire bonding does not need to be changed when fabricating the first or second conductive lines. In light of the above, when fabricating the multi-chip package of the present invention, the speed and yield of the wire bonding process are improved and thus productivity is promoted and cost is decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip package, comprising:
   a substrate;
   a plurality of chip pads disposed on the substrate, wherein the chip pads are arranged in an M×N array, a peripheral area of each of the chip pads comprises a first bonding pad, a second bonding pad, a third bonding pad, and a fourth bonding pad arranged in sequence in a clockwise direction, and the orientations of each of the first to fourth bonding pads in the $S^{th}$ row are different respectively from the orientations of each of the first to fourth bonding pads in the $(S-1)^{th}$ row and the $(S+1)^{th}$ row by 90 degrees, wherein M and N being positive integers greater than 1 and S being a positive integer in the range of 2~N;
   a plurality of LED chips each disposed on one of the chip pads;
   a first electrode comprising a plurality of first branch lines respectively connected to the M first bonding pads in the $1^{st}$~$N^{th}$ rows;
   a second electrode comprising a plurality of second branch lines respectively connected to the M second bonding pads in the $1^{st}$~$N^{th}$ rows;
   a third electrode comprising a plurality of third branch lines respectively connected to the M third bonding pads in the $1^{st}$~$N^{th}$ rows; and
   a fourth electrode comprising a plurality of fourth branch lines respectively connected to the M fourth bonding pads in the $1^{st}$~$N^{th}$ rows,
   wherein each LED chip is electrically connected to two of the bonding pads on a same side of each LED chip, and the two bonding pads are selected from the first, second, third, and fourth bonding pads.

2. The multi-chip package according to claim 1, wherein the orientations of each of the first to fourth bonding pads in the $S^{th}$ row are different from the orientations of each of the first to fourth bonding pads in the $(S-1)^{th}$ row by 90 degrees in the counterclockwise direction.

3. The multi-chip package according to claim 1, wherein the orientations of each of the first to fourth bonding pads in the $S^{th}$ row are different from the orientations of each of the first to fourth bonding pads in the $(S-1)^{th}$ row by 90 degrees in the clockwise direction.

4. The multi-chip package according to claim 1, wherein the first electrode has a first main body portion, the second electrode has a second main body portion, the third electrode has a third main body portion, the fourth electrode has a fourth main body portion, and the first, second, third, and fourth main body portions are sequentially arranged clockwise in the peripheral area of the M×N array formed by the chip pads.

5. The multi-chip package according to claim 1, wherein the substrate includes an insulation layer, the first electrode, the second electrode, and the first to fourth bonding pads are disposed on the insulation layer, and the third electrode and the fourth electrode are disposed under the insulation layer and pass through the insulation layer to respectively connect to the third bonding pads and the fourth bonding pads.

6. The multi-chip package according to claim 1, further comprising a plurality of first conductive lines and a plurality of second conductive lines, wherein each of the first conductive lines and each of the second conductive lines are respectively electrically connected to each LED chip and two of the bonding pads on a same side of each LED chip.

7. The multi-chip package according to claim 6, wherein the first conductive lines in each pair and the second conductive lines in each pair are respectively electrically connected to each LED chip and two of the bonding pads on a same side of each LED chip.

8. The multi-chip package according to claim 1, further comprising a coating layer disposed on the insulation layer and covering the first, second, third, and fourth bonding pads, and the coating layer has a plurality of openings to expose the LED chips and portions of the first to fourth bonding pads in the peripheral area of each LED chip, wherein the portions of the first to fourth bonding pads are adjacent to each LED chip.

9. The multi-chip package according to claim 8, wherein the coating layer comprises resin.

* * * * *